US012567851B2

(12) United States Patent (10) Patent No.: US 12,567,851 B2
Mizusawa (45) Date of Patent: Mar. 3, 2026

(54) BASE FOR PIEZOELECTRIC DEVICE AND PIEZOELECTRIC DEVICE

(71) Applicant: NIHON DEMPA KOGYO CO., LTD., Tokyo (JP)

(72) Inventor: Shuichi Mizusawa, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 1038 days.

(21) Appl. No.: 17/684,379

(22) Filed: Mar. 1, 2022

(65) Prior Publication Data

US 2022/0302895 A1    Sep. 22, 2022

(30) Foreign Application Priority Data

Mar. 17, 2021    (JP) ................................. 2021-043011
Nov. 3, 2021    (JP) ................................. 2021-179882

(51) Int. Cl.
H03H 9/10    (2006.01)
H03H 9/19    (2006.01)

(52) U.S. Cl.
CPC ............. H03H 9/1021 (2013.01); H03H 9/19 (2013.01)

(58) Field of Classification Search
CPC ...... H03H 9/1021; H03H 9/19; H03H 9/0538; H03H 9/875; H03H 9/88
See application file for complete search history.

(56) References Cited

U.S. PATENT DOCUMENTS

2010/0320872 A1* 12/2010 Numata ............... H03H 9/1021
29/25.35
2019/0312566 A1* 10/2019 Kimura ............. H03H 9/02102

FOREIGN PATENT DOCUMENTS

| JP | 2000068780 | | 3/2000 |
| JP | 2007274071 | | 10/2007 |
| JP | 2009225223 | A * | 10/2009 |
| JP | 2009246781 | A * | 10/2009 |
| JP | 2010278805 | A * | 12/2010 |
| JP | 2012191660 | A * | 10/2012 |
| JP | 2013051560 | | 3/2013 |
| JP | 5213614 | B2 * | 6/2013 |
| JP | 2013229645 | | 11/2013 |
| JP | 2014192644 | | 10/2014 |
| JP | 2014239358 | | 12/2014 |
| JP | 2015033035 | | 2/2015 |
| JP | 2015089037 | A * | 5/2015 |

* cited by examiner

*Primary Examiner* — J. San Martin
(74) *Attorney, Agent, or Firm* — JCIPRNET

(57) ABSTRACT

A base for a piezoelectric device includes: a first substrate, mounting pads, a contact hole and a contact hole wiring, a first metal film, a second substrate, a second metal film, a routing wiring, a castellation, and an external mounting terminal. The second substrate is made of a material identical to the material of the first substrate. The second substrate is bonded to the first substrate by intermetallic bonding. The second metal film is disposed on a third surface. The third surface is a surface on the first substrate side of the second substrate. The second metal film constitutes the intermetallic bonding together with the first metal film. The routing wiring reaches a fourth surface that is an opposite surface of the third surface of the second substrate via the third surface and a side surface of the second substrate from the contact hole wiring.

16 Claims, 15 Drawing Sheets

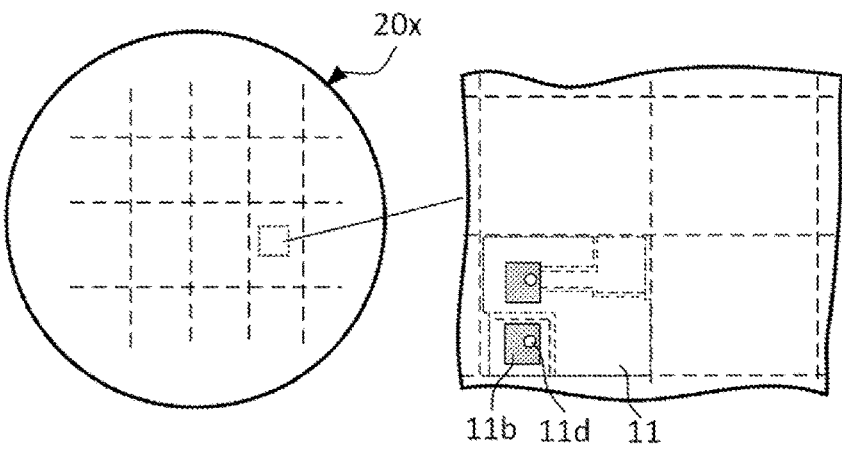
FIG. 2A
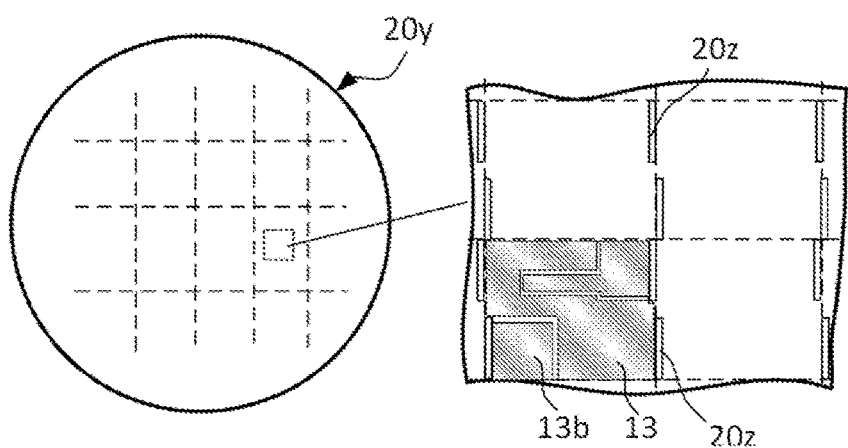
FIG. 2B
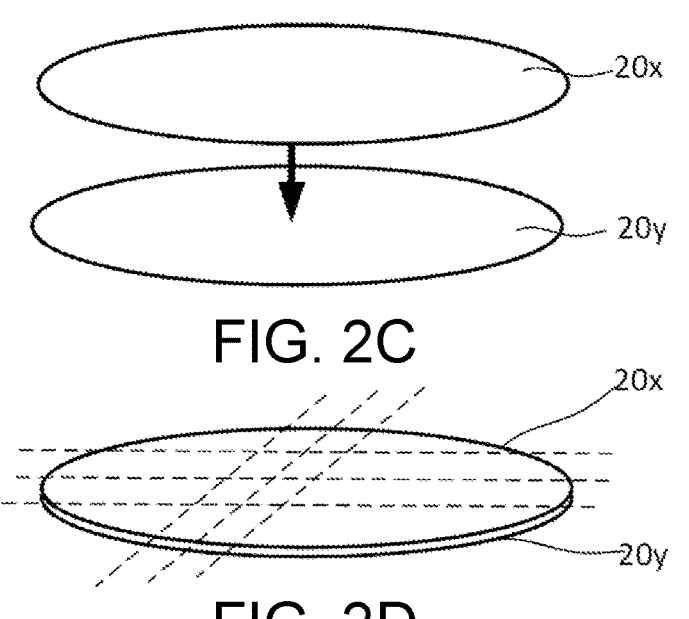
FIG. 2C
FIG. 2D (VIIIB-VIIIB CROSS SECTION)

BASE FOR PIEZOELECTRIC DEVICE AND PIEZOELECTRIC DEVICE

CROSS-REFERENCE TO RELATED APPLICATIONS

This application claims priority to and the benefit of Japan Patent Application No. 2021-43011 filed on Mar. 17, 2021 and Japan Patent Application No. 2021-179882 filed on Nov. 3, 2021, in the Japan Patent Office, and the disclosures of which are incorporated herein by reference in its entirety.

TECHNICAL FIELD

The disclosure relates to a base for a piezoelectric device and the piezoelectric device using the base.

DESCRIPTION OF THE RELATED ART

In the piezoelectric device, a container for containing a piezoelectric element is indispensable. Thus, in a quartz crystal device as one kind of the piezoelectric device, various containers such as a metal container, a ceramic container, and a container using glass or crystal have been used or studied. Especially, in a mass production type quartz crystal device, since demand for a surface mount type quartz crystal device is high, surface mount type containers are frequently used.

A typical container suitable for the surface mount type and mass production is a ceramic container. Specifically, it is a container where a ceramic base and a lid made of metal or ceramic are bonded with one another. A ceramic base is typically a base where a bottom plate having a rectangular shape in plan view formed of a ceramic material and a dike portion formed of a ceramic material laminated on the bottom plate are integrally fired (for example, the paragraph 26, FIG. 1, and the like of Japanese Unexamined Patent Application Publication No. 2007-274071).

As one example of a container using crystal and glass, for example, as disclosed in Japanese Unexamined Patent Application Publication No. 2000-68780, there is a container having a structure where a crystal structure in which a quartz-crystal vibrating piece and an outer frame are integrally formed, an upper plate made of glass, and a lower plate made of glass are bonded by an anodic bonding method (ABSTRACT, FIG. 1, FIG. 3, and the like of Japanese Unexamined Patent Application Publication No. 2000-68780).

As another example of a glass container, for example, as disclosed in Japanese Unexamined Patent Application Publication No. 2014-192644, there is a container having a structure where a lid and a base formed of borosilicate glass are directly bonded (the paragraph 18, 32, FIG. 1B, and the like of Japanese Unexamined Patent Application Publication No. 2014-192644).

As one example of a crystal container, for example, as disclosed in Japanese Unexamined Patent Application Publication No. 2015-33035, there is a container having a structure formed by bonding a lid wafer, a piezoelectric wafer, and a base wafer constituted of a quartz-crystal wafer by a bonding material or direct wafer bonding and then individualizing this to an individual piezoelectric device (the paragraph 72, 75, 76, FIG. 8, FIG. 9, and the like of Japanese Unexamined Patent Application Publication No. 2015-33035).

Among the various containers described above, the container that is currently most excellent is the one that uses a ceramic base. However, as thinning and downsizing of a piezoelectric device advance, it can be said that a ceramic base has limitations in terms of structure, accuracy, and cost. Consequently, a base having a new structure that can substitute for a ceramic base and can surpass the conventional containers using above-described glass and/or crystal.

A need thus exists for a base for a piezoelectric device and the piezoelectric device which are not susceptible to the drawback mentioned above.

SUMMARY

According to an aspect of this disclosure, there is provided a base for a piezoelectric device. The base includes: a first substrate, a mounting pad, a contact hole and a contact hole wiring, a first metal film, a second substrate, a second metal film, a routing wiring, a castellation, and an external mounting terminal. The first substrate is formed of glass or crystal. The mounting pad is for a piezoelectric element disposed on a first surface of the first substrate. The contact hole and the contact hole wiring are disposed on the first substrate. The contact hole and the contact hole wiring extend from the mounting pad to a second surface that is an opposite surface of the first surface. The first metal film is disposed in a region including a peripheral region of the contact hole of the second surface. The second substrate is made of a material identical to the material of the first substrate. The second substrate is bonded to the first substrate by an intermetallic bonding. The second metal film is disposed on a third surface. The third surface is a surface on a side of the first substrate of the second substrate. The second metal film constitutes the intermetallic bonding together with the first metal film. The routing wiring reaches a fourth surface that is an opposite surface of the third surface of the second substrate via the third surface and a side surface of the second substrate from the contact hole wiring. The castellation is disposed on the side surface for the routing wiring. The external mounting terminal is disposed on the fourth surface. The external mounting terminal is connected to the routing wiring.

BRIEF DESCRIPTION OF THE DRAWINGS

The foregoing and additional features and characteristics of this disclosure will become more apparent from the following detailed description considered with reference to the accompanying drawings, wherein:

FIG. 2A to FIG. 2D are drawings for describing one example of a manufacturing method of the base of the disclosure;

DETAILED DESCRIPTION

Figure 1A:
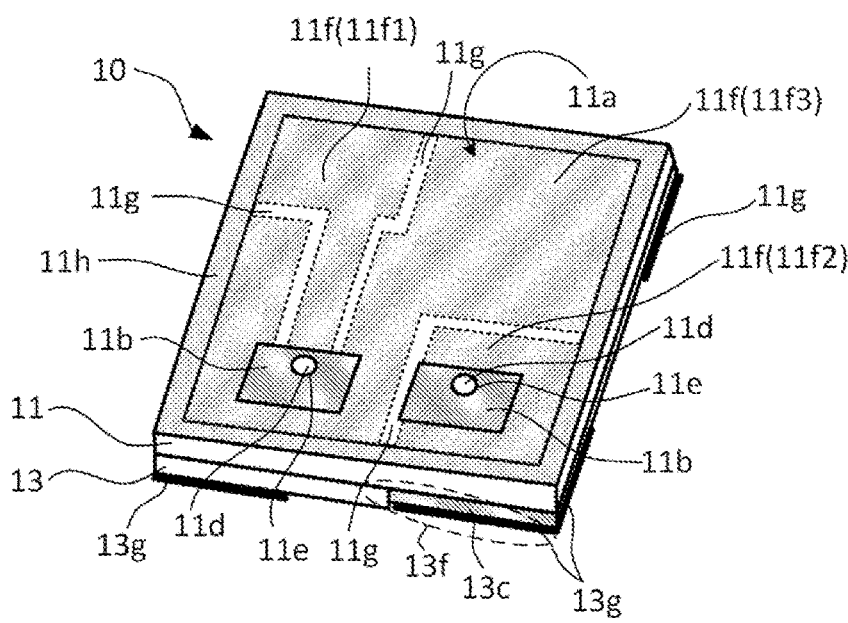
FIG. 1A and FIG. 1B are drawings for describing a base 10 of a first embodiment.

The following describes embodiments of a base and a piezoelectric device of this disclosure with reference to the attached drawings. Each drawing used in the description is merely illustrated schematically for understanding this disclosure. In each drawing used in the description, like reference numerals designate corresponding or identical elements, and therefore such elements may be omitted here. Shapes, dimensions, materials, and a similar factor described in the following explanations are merely preferred examples within the scope of this disclosure. Therefore, this disclosure is not limited to only the following embodiments.

1. Base of First Embodiment

Figure 1B:
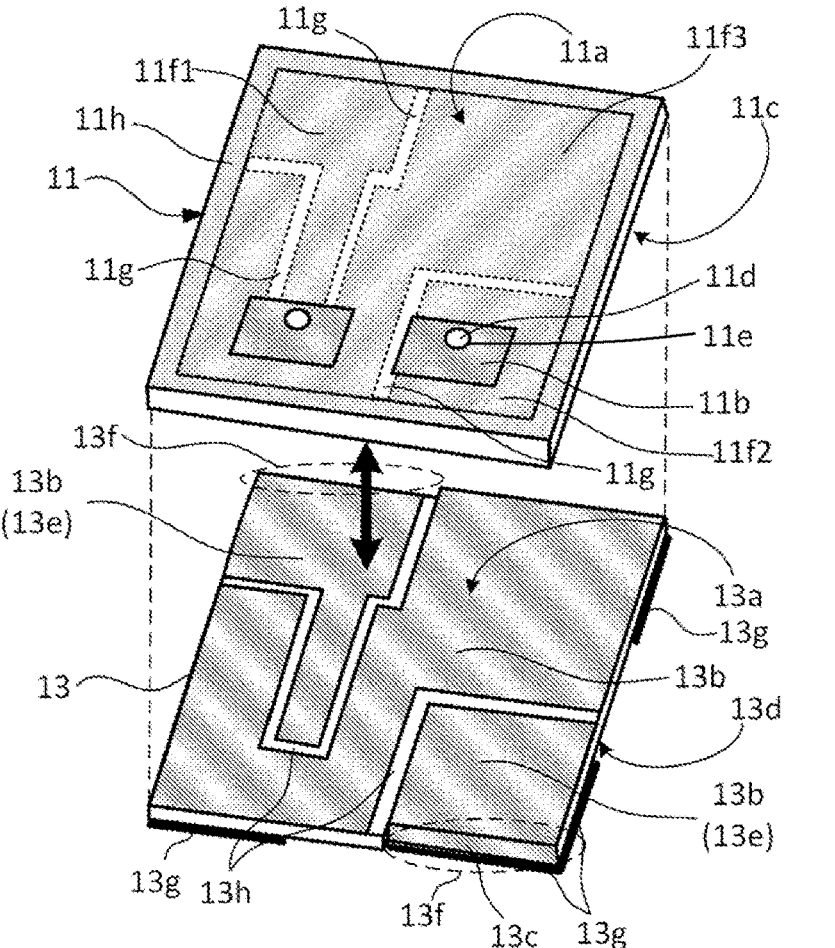

FIG. 1A and FIG. 1B are drawings for describing a base 10 of the first embodiment. Especially, FIG. 1A is a perspective view of the base 10, and FIG. 1B is an exploded perspective view illustrating the base 10 by dividing the base 10 into a first substrate 11 and a second substrate 13.

The base 10 of the embodiment includes the first substrate 11, mounting pads 11b for a piezoelectric element, contact holes 11d and contact hole wirings 11e, a first metal film 11f, insulation regions 11g, and a sealing pattern 11h. The first substrate 11 is formed of glass or crystal. The mounting pads 11b are disposed on a first surface 11a of the first substrate 11. The contact holes 11d and the contact hole wirings 11e are disposed in the first substrate 11 and extend to a second surface 11c, which is an opposed surface to the first surface 11a, from the mounting pads 11b. The first metal film 11f and the insulation regions 11g are disposed in regions including peripheral regions of the contact holes 11d of the second surface 11c.

Figure 3A:
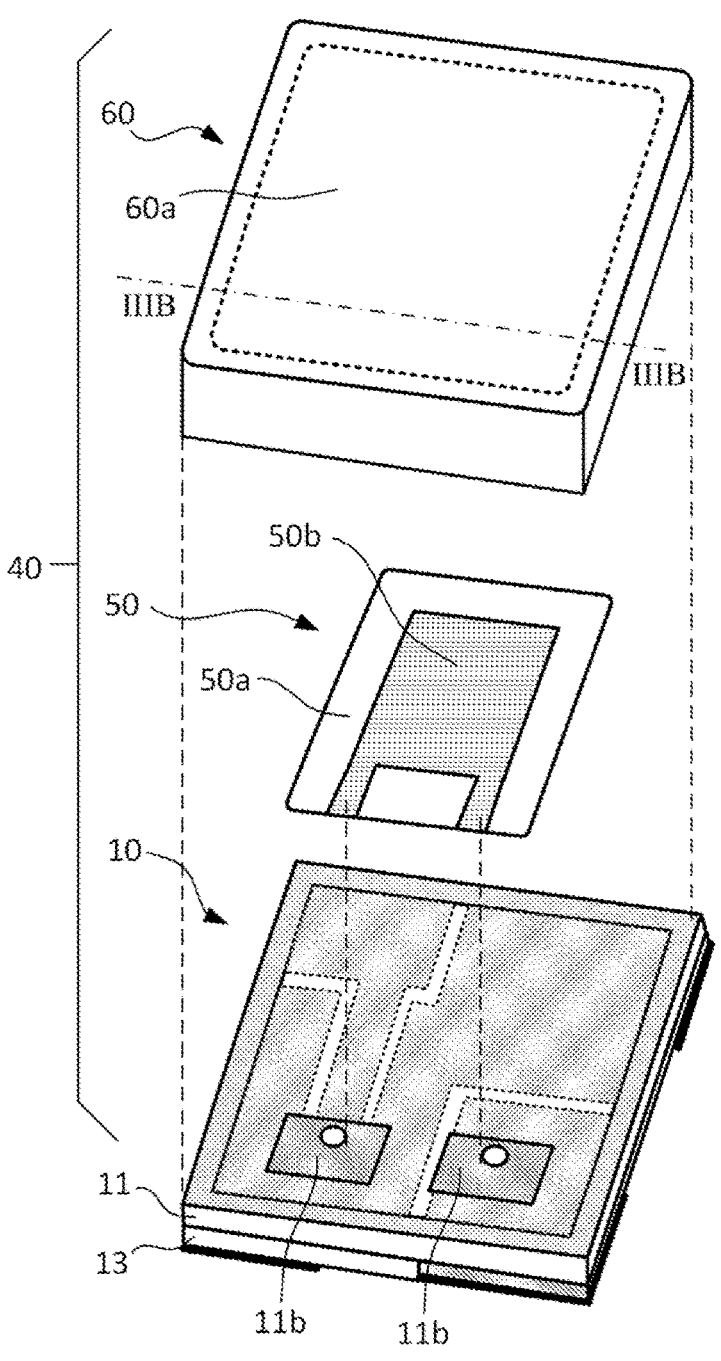
FIG. 3A and FIG. 3B are drawings for describing a piezoelectric device 40 of the first embodiment.
Figure 3B:
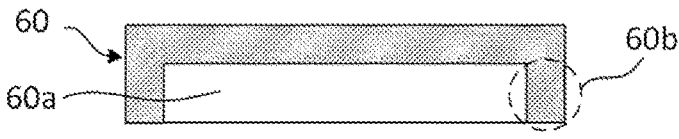

Furthermore, the base 10 includes the second substrate 13, a second metal film 13b, routing wirings 13e, castellations 13f, and external mounting terminals 13g (see FIG. 3A and FIG. 3B). The second substrate 13 is formed of a material identical to the first substrate and bonded to the first substrate 11 by intermetallic bonding. The second metal film 13b is disposed on a third surface 13a, which is a surface of the second substrate 13 on the first substrate 11 side and constitutes the intermetallic bonding with the first metal film 11f, namely, by being bonded to the first metal film 11f. The routing wirings 13e reach a fourth surface 13d, which is an opposed surface to the third surface 13a of the second substrate 13, from the routing wirings 13e, via the third surface 13a and side surfaces 13c of the second substrate 13.

The castellations 13f are disposed on the side surfaces 13c for the routing wirings 13e. The external mounting terminals 13g are disposed on the fourth surface 13d and connected to the routing wiring. The following describes specific examples of the respective components described above.

The first substrate 11 has, in this case, a square planar shape. In a case of crystal, a specific material of the first substrate 11 is preferably a Z-cut plate or an AT-cut plate. Each of the Z-cut plate and the AT-cut plate of crystal is a substrate mass-produced for a crystal unit, and thus also has an advantage in cost. When the specific material of the first substrate 11 is glass, any given preferred glass such as soda-lime glass may be used.

To the mounting pads 11b, a piezoelectric element 50 (see FIG. 3A and FIG. 3B) is connected and fixed by a conductive adhesive or the like. The mounting pad 11b has a shape corresponding to a mounting structure of the piezoelectric element and is disposed at any location on the first surface 11a of the first substrate 11. In a case of this example, since a structure where the piezoelectric element is held in a cantilever manner is illustrated, the mounting pads 11b are disposed at two locations that are in a proximity of one side of the first substrate 11 and are separated from one another in a direction along the one side. More specifically, as will be described later by using FIG. 3A and FIG. 3B, the piezoelectric element 50 (see FIG. 3A and FIG. 3B) to be mounted to the first substrate has a rectangular shape in plan view, and the mounting pads 11b are disposed at two locations on the first substrate corresponding to both ends along one side at the one side of the rectangular shaped piezoelectric element 50. The planar shape of the mounting pad 11b can be any shape such as a square shape, a circle shape, or an elliptical shape. The mounting pad 11b can be formed of any given preferred/any suitable metal film, for example, a laminated film of a chrome film and a gold film, or the like.

The contact holes 11d and the contact hole wirings 11e extend from the first surface 11a to the second surface 11c of the first substrate 11 and can be formed by using, for example, a photolithography technique, an etching technique, and a film forming technique on the first substrate 11. A constituent material of the contact hole wiring 11e can be constituted of, for example, a material similar to that of the mounting pad 11b.

The first metal film 11f is one member for bonding the first substrate 11 and the second substrate 13 by intermetallic bonding and serves as one of sealing members for ensuring airtightness of the contact hole 11d. Thus, in the case of this example, the first metal film 11f is constituted of three portions of a first portion 11f1 having a planar shape that surrounds one periphery of two contact holes 11d, a second portion 11f2 having a planar shape that surrounds another periphery of the two contact holes 11d, and a third portion 11f3 being in charge of other region. Since the above-described three portions 11f1, 11f2, and 11f3 of the first metal film 11f are each required to be electrically separated, they are separated by the insulation regions 11g where the metallic film is removed. However, in order to widen an intermetallic bonding area with the second metal film 13b, which will be described later, it is preferred to make areas of the insulation regions 11g minimum necessary.

The second metal film 13b disposed on a second substrate 13 side is the other member for bonding the first substrate 11 and the second substrate 13 by intermetallic bonding and serves as the other of the sealing members for ensuring airtightness of the contact holes 11d. Accordingly, the second metal film 13b is constituted of three portions corresponding to the three portions 11/1, 11/2, and 11/3 of the first metal film 11*f*, and those three portions are separated by insulation regions 13*h*. It is preferred to make areas of the insulation regions 13*h* minimum necessary, similarly to the insulation regions 11*g* described above.

Figure 10A:
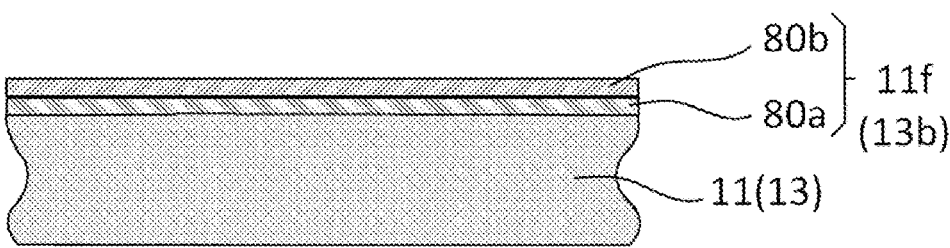
FIG. 10A to FIG. 10C are drawings for describing specific exemplary configurations of the first metal film and the second metal film.

Here, respective materials of the first metal film 11*f* and the second metal film 13*b* will be described with reference to FIG. 10A to FIG. 10C. These drawings are cross-sectional drawings of a structure of the first substrate 11 (or the second substrate 13) and the first metal film 11*f* (or the second metal film 13*b*).

Each of the first metal film 11*f* and the second metal film 13*b* can be formed of any given preferred metal film where the intermetallic bonding can be performed. For example, it can be formed of a laminated film of a chrome film 80*a* and a gold film 80*b*, which are laminated in this order from the first substrate side (FIG. 10A). As a result, the first metal film 11*f* and the second metal film 13*b* can collaborate with one another to generate the intermetallic bonding between the gold films, and thus, the first substrate 11 and the second substrate 13 can be bonded by the intermetallic bonding.

Figure 10B:
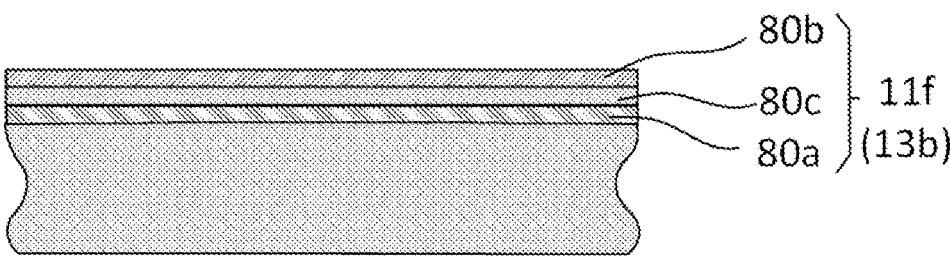

More preferably, as illustrated in FIG. 10B, each of the first metal film 11*f* and the second metal film 13*b* is preferably formed of a three-layer structure aminated film of the chrome film 80*a* as a foundation film, a nickel film or nickel-tungsten alloy film 80*c* as an intermediate film, and the gold film 80*b* as an upper layer film. This is because forming the intermediate film with the nickel film or nickel-tungsten alloy film allows reducing diffusion of the chrome film as the foundation film into the gold film as the upper layer film, and thus, the intermetallic bonding by the first metal film and the second metal film can be properly performed. It is considered that this three-layer structure aminated film can reduce the diffusion of chrome into the gold film over time.

Figure 10C:
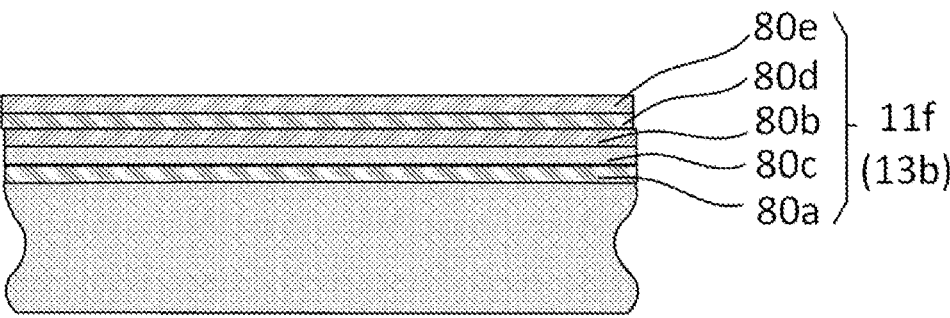

More preferably, as illustrated in FIG. 10C, each of the first metal film 11*f* and the second metal film 13*b* is preferably formed of a five-layer structure metal film including a laminated film formed of a titanium film 80*d* and a gold film 80*e* laminated on the titanium film 80*d*, on the gold film 80*b* as the upper layer film of the above-described three-layer structure metal film. This is because since chrome sometimes diffuses into the gold film even when the nickel film or nickel-tungsten alloy film is disposed, adding the titanium film allows reducing diffusion of chrome into the gold film of the uppermost layer, and thus, the intermetallic bonding can be performed more properly. It is considered that this five-layer structure aminated film can also reduce the diffusion of chrome into gold over time.

The sealing pattern 11*h* (FIG. 1A and FIG. 1B) is the one for bonding a lid member 60 (see FIG. 3A and FIG. 3B), which will be described later, to the base 10. The base 10 of the embodiment shows an example where the lid member is bonded to the base with a brazing material, for example, a gold tin alloy. Accordingly, the sealing pattern 11*h* is formed of any given preferred material that is easily bonded to the gold tin alloy. The sealing pattern 11*h* is disposed along the edge of the first substrate 11 with a predetermined width.

Figure 11A:
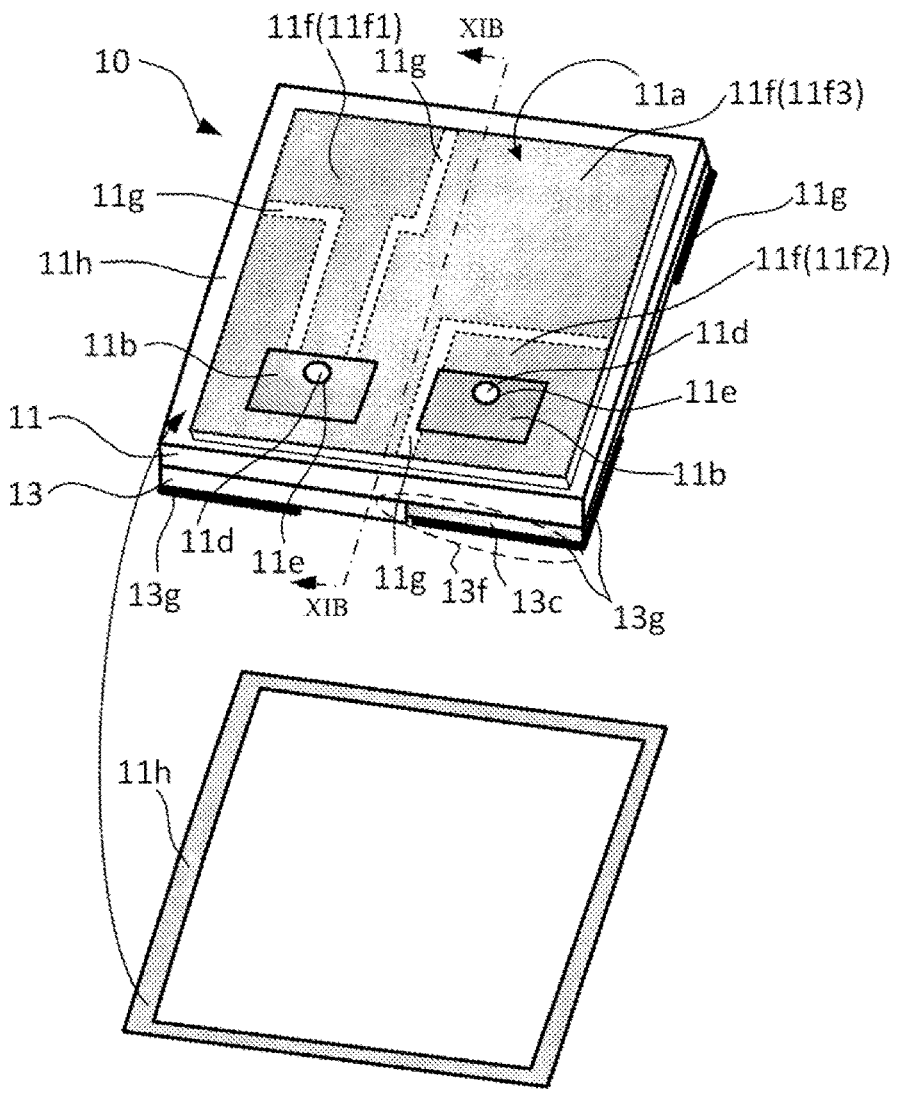
FIG. 11A and FIG. 11B are drawings for describing a preferred structural example when a sealing pattern is disposed.
Figure 11B:
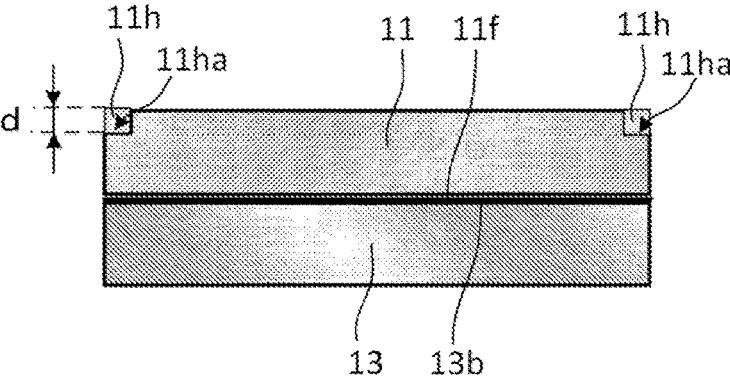

When the sealing pattern 11*h* is disposed on the first surface 11*a* of the first substrate 11, as illustrated in FIG. 11A and FIG. 11B, it is preferred that a depressed portion 11*ha* having a depth d (see FIG. 11B) equivalent to a thickness of the sealing pattern 11*h* is disposed in the region of the first surface 11*a* of the first substrate 11, where the sealing pattern 11*h* is disposed, and the sealing pattern 11*h* is disposed inside the depressed portion 11*ha*. While the thickness itself of the sealing pattern 11*h* sometimes become a problem due to a low profile when achieving a low profile type piezoelectric device is desired, forming a structure where the sealing pattern 11*h* is embedded in the depressed portion 11*ha* like this preferred example allows suppressing an increase of the piezoelectric device thickness due to the thickness of the sealing pattern 11*h*. FIG. 11B is a schematic cross-sectional drawing of the base 10 taken along the line XIB-XIB of FIG. 11A.

The second substrate 13 is bonded to the first substrate by the intermetallic bonding between the above-described first metal film and second metal film. The second substrate 13 is formed of a material identical to that of the first substrate 11 and has a planar shape approximately identical to that of the first substrate 11. However, the planar shape of the second substrate 13 is slightly different from that of the first substrate 11 in that the castellations 13*f* are disposed in the second substrate 13. The castellations 13*f* will be described later.

The routing wirings 13*e* are wirings that reach the fourth surface 13*d* from the contact hole wirings 11*e* via the third surface 13*a* and the side surfaces 13*c* of the second substrate 13. However, the routing wirings 13*e* are formed by using a part of the first metal film 11*f* and the second metal film 13*b*. Specifically, the routing wirings 13*e* between the first substrate 11 and the second substrate 13 are formed of the first portion 11/1 and the second portion 11/2 of the first metal film and the second metal film 13*b* (13*e*) opposed thereto. The portions of the routing wirings 13*e* that reach the external mounting terminals 13*g* from the side surfaces 13*c* of the second substrate 13 are formed of the metal films that continue to the second metal film 13*b*.

The castellations 13*f* are the ones for routing the routing wirings 13*e* to the external mounting terminals 13*g*. At a part of each of two opposite sides of the second substrate 13, the castellations 13*f* are formed in a cut-out shape that is slightly depressed from the edge to the center of the second substrate 13. While the detail will be described later using FIG. 2A to FIG. 2D, the castellations 13*f* can be formed by disposing elongated-hole-shaped holes in plan view to a wafer for forming the second substrate 13 and then dividing the wafer into the second substrate by a dicing saw or the like. While the number of the castellation is two in the illustrated example, there may be three or more.

The external mounting terminals 13*g* are disposed on the fourth surface 13*d* and connected to the above-described routing wirings 13*e*. The external mounting terminals 13*g* are terminals used when the piezoelectric device (see FIG. 3A and FIG. 3B) manufactured using the base 10 of the disclosure is mounted to various kinds of electronic equipment. In this example, while, as the external mounting terminals 13*g*, four terminals are indicated, the number of terminals is not limited to this. In this case, two terminals among the four terminals are example of non-connection (NC). In a case where the piezoelectric device has a grounding structure, or the like, these non-connection terminals can be used as a grounding terminal.

2. Manufacturing Method Examples of Base 10

Next, for understanding the base of the disclosure deeply, the manufacturing method examples of the base 10 of the first embodiment will be described. FIG. 2A to FIG. 2D are drawings for describing the manufacturing method examples.

To form the first substrate 11, a wafer 20*x* made of crystal is prepared, and on the wafer 20*x*, the first substrate 11, namely, the mounting pads 11*b*, the contact holes 11*d*, the contact hole wirings 11e, and the first metal film 11f are formed in a matrix by the well-known photolithography technique, film forming technique, and etching technique (FIG. 2A).

To form the second substrate 13, a wafer 20y made of crystal is prepared, and on the wafer 20y, the second metal film 13b, holes 20z for the castellations, and the like are formed by the well-known photolithography technique, film forming technique, and etching technique (FIG. 2B).

Next, the wafer 20x and the wafer 20y are stacked in a predetermined positional relationship and then they are heated and pressurized with a predetermined force in a low pressure atmosphere in a vacuum chamber (FIG. 2C). This process causes the first metal film 11f and the second metal film 13b to be bonded by the intermetallic bonding with one another, and thus, the wafer 20x and the wafer 20y are bonded with one another, and, consequently, the first substrate 11 and the second substrate 13 are bonded with one another (FIG. 2D).

Next, the bonded wafers described above undergo dicing, for example, by a dicing saw along predetermined lines, and the base 10 of the first embodiment is obtained.

While the first substrate 11 and the second substrate 13 are bonded by the intermetallic bonding between the first metal film 11f and the second metal film 13b, at that time, the first substrate 11 and the second substrate 13 are pressurized at a predetermined pressure from the surface opposite to the bonding surface. When this pressing force can be reduced as much as possible, it is possible to reduce a device cost of a bonding device and to increase manufacturing throughput. For that purpose, as described below with reference to FIG. 12A to FIG. 12C and FIG. 13A and FIG. 13B, on the second surface 11c of the first substrate 11 and/or the third surface 13a of the second substrate 13, a plurality of protruding shape regions 90 for concentrating a bonding force applied to the first substrate 11 and the second substrate 13 from outside during performing the intermetallic bonding may be included. One example of that is indicated in FIG. 12A to FIG. 12C.

Figure 12A:
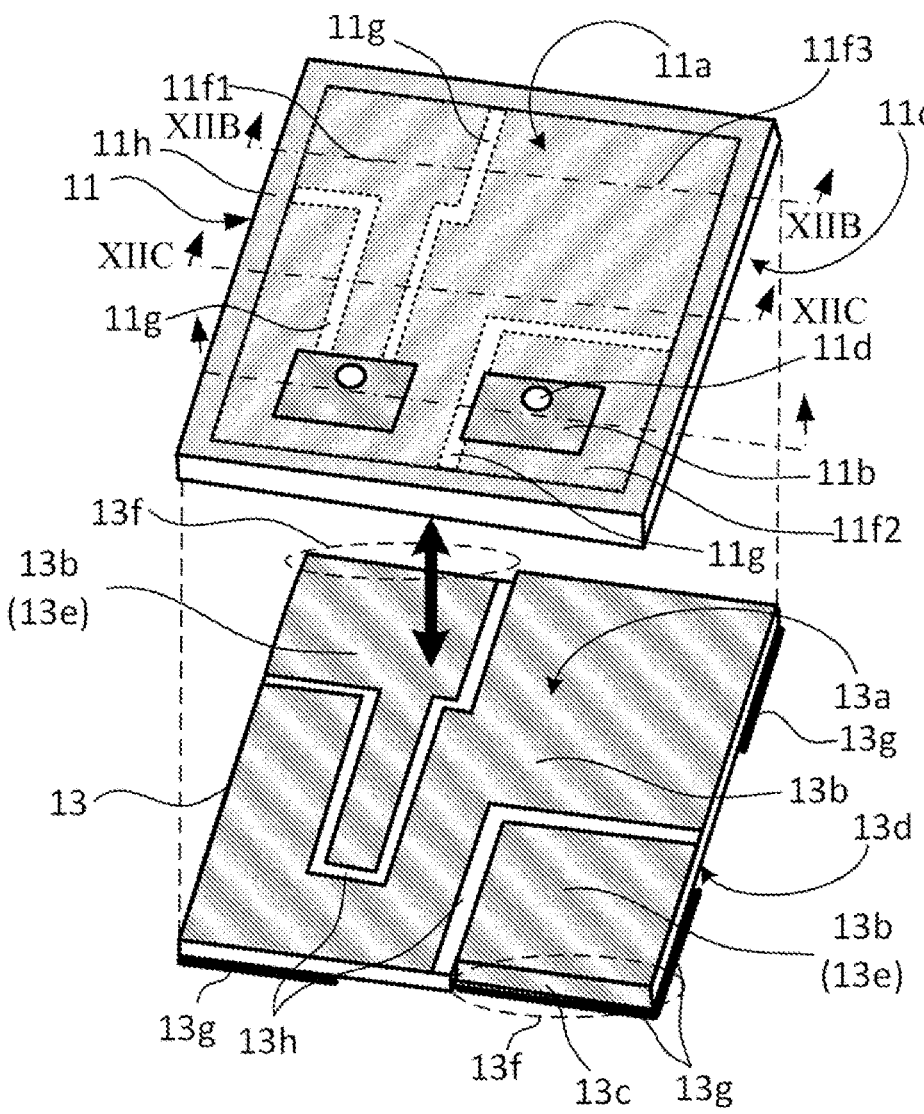
FIG. 12A to FIG. 12C are drawings for describing a structural example preferred for bonding pressure reduction in performing intermetallic bonding.
Figure 12B:
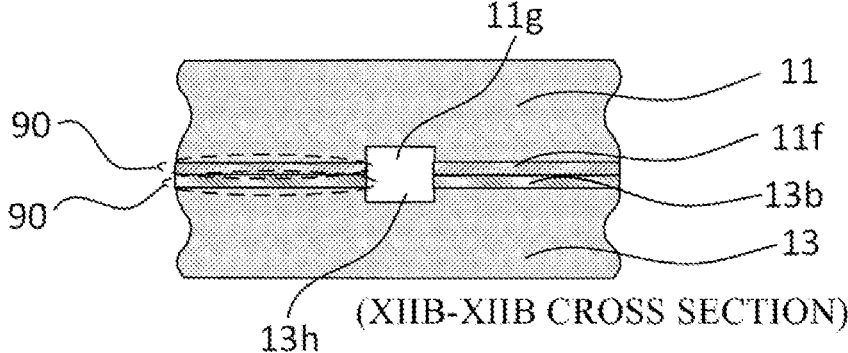
Figure 12C:
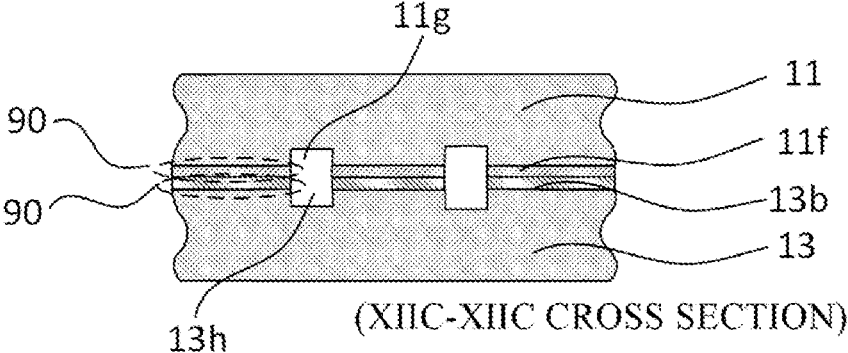

First, FIG. 12A is an example where the protruding shape regions 90 are formed by making the respective regions corresponding to the insulation regions 11g of the first substrate 11 and the insulation regions 13h of the second substrate 13 to be in a depressed shape and, as a result, making the portions other than these insulation regions 11g and 13h to be in a protruding shape. FIG. 12B is a cross-sectional view taken along the line XIIB-XIIB of FIG. 12A, and FIG. 12C is a cross-sectional view taken along the line XIIC-XIIC of FIG. 12A, and the protruding shape regions 90 are clearly indicated in these cross-sectional views.

Figure 13A:
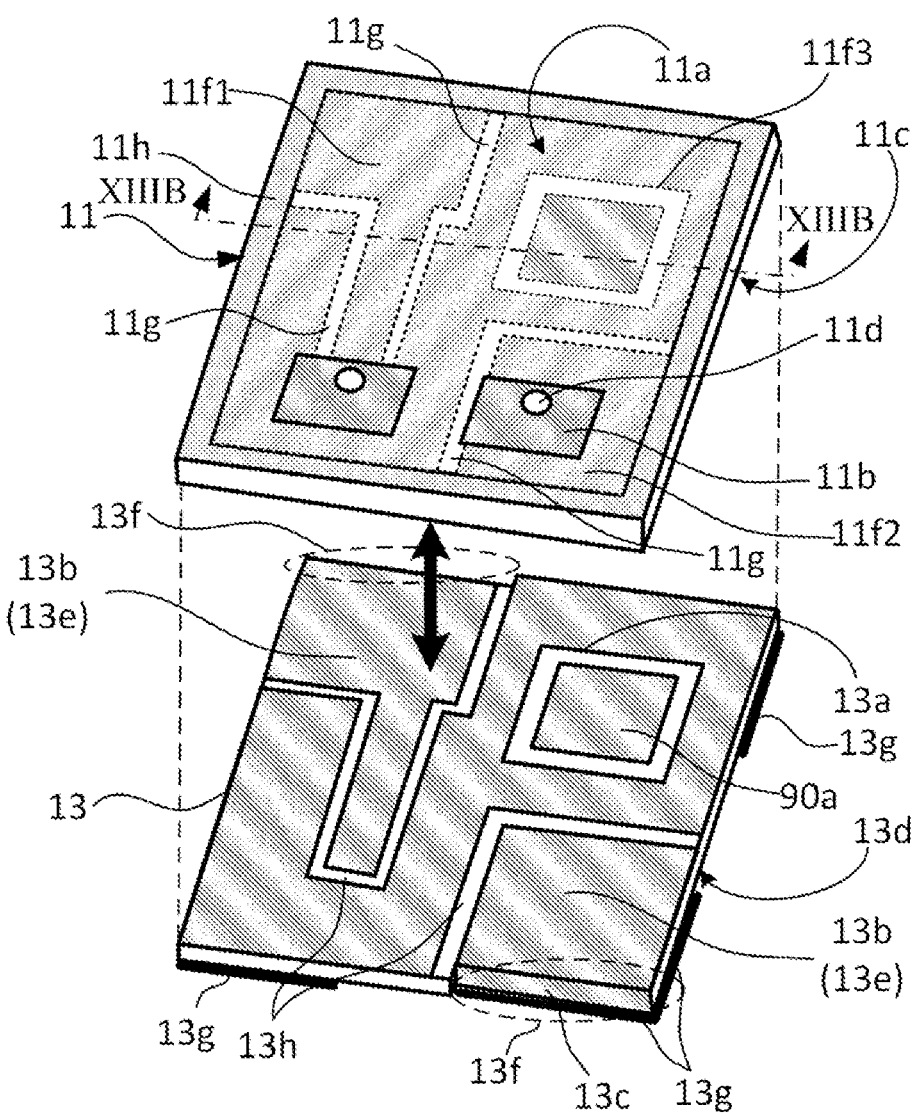
FIG. 13A and FIG. 13B are drawings for describing a structural example preferred for bonding pressure reduction in performing intermetallic bonding continuous with FIG. 12A to FIG. 12C.
Figure 13B:
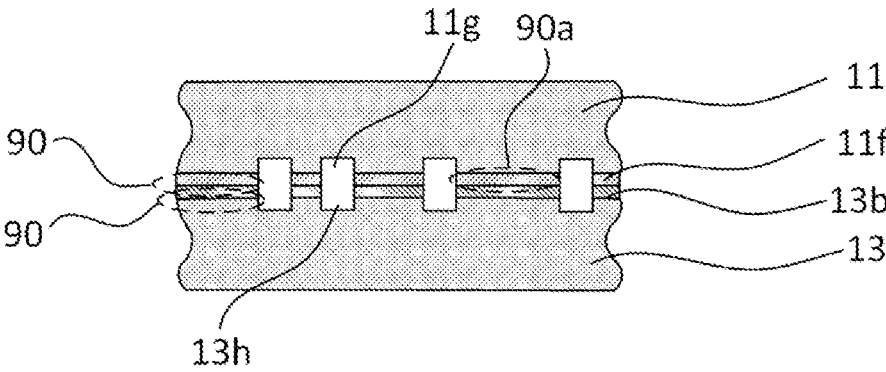

FIG. 13A is an example where the protruding shape regions 90 are formed by making the respective regions corresponding to the insulation regions 11g of the first substrate 11 and the insulation regions 13h of the second substrate 13 to be in a depressed shape and also making a part of other regions to be in a depressed shape and, as a result, making the portions other than these regions formed in a depressed shape of the first substrate 11 and the second substrate 13 to be in a protruded shape. In the perspective view illustrated in FIG. 13A, a protruding shape region 90a disposed other than the proximity of the insulation regions 11g and 13h are clearly indicated. FIG. 13B is a cross-sectional view taken along the line XIIIB-XIIIB of FIG. 13A, and the protruding shape regions 90 and 90a are clearly indicated in this cross-sectional view.

In the above-described example, while the protruding shape regions 90 and 90a are disposed on the surfaces opposed to one another of both the first substrate 11 and the second substrate 13, the protruding shape regions 90 and 90a may be disposed only on one side of the opposed surfaces of the first substrate 11 and the second substrate 13. Setting a ratio of areas of the protruding shape regions 90 and 90a to an area of the substrates of the first substrate 11 and the second substrate 13 to what extent is determined in consideration of reliability of the intermetallic bonding and reduction of the pressing force. While not limited to this, the ratio of the area of the protruding shape regions 90 and 90a to the area of the substrates of the first substrate 11 and the second substrate 13 is preferably selected from a range of 20% to 50%.

3. Piezoelectric Device of First Embodiment

Next, a piezoelectric device 40 of the first embodiment will be described. FIG. 3A is an exploded perspective view for describing the piezoelectric device 40 of the first embodiment. FIG. 3B is a cross-sectional view of the lid member 60 taken along the line IIIB-IIIB of FIG. 3A.

The piezoelectric device 40 of the first embodiment includes the above-described base 10 of the first embodiment, the quartz-crystal vibrating piece 50 as the piezoelectric element, and the lid member 60.

While the quartz-crystal vibrating piece 50 is not especially limited, it is typically an AT-cut vibrating piece. In that case, the quartz-crystal vibrating piece 50 as the piezoelectric element includes a AT-cut crystal element 50a and excitation electrodes 50b disposed on a front surface and a back surface of the AT-cut crystal element 50a.

The lid member 60 has a cap-shaped structure including a depressed portion 60a that can contain the quartz-crystal vibrating piece 50 and a dike 60b disposed in a periphery of the depressed portion 60a.

The quartz-crystal vibrating piece 50 is connected and fixed to the mounting pads 11b at locations of extraction wirings extracted from the excitation electrodes 50b, with a conductive adhesive (not illustrated).

The lid member 60 is bonded to the base 10, in which the quartz-crystal vibrating piece 50 has been mounted to the mounting pads 11b with, in the case of this example, the gold tin alloy, and the quartz-crystal vibrating piece 50 is sealed. In sealing, a sealing space is preferably a pressure-reduced atmosphere, a nitrogen atmosphere, or an inert gas atmosphere.

The lid member 60 is preferably made of metal in terms of cost and ease of manufacturing. While a metal material of which the lid member 60 is made may be any given preferred metal material, the following metal materials are preferred, considering linear expansion coefficients of the first substrate and the second substrate.

When each of the first substrate 11 and the second substrate 13 is formed of the crystal, the linear expansion coefficient (ppm/° C.) of the crystal is 11.4 in a direction parallel to an optical-axis and 19.5 in a direction perpendicular to the optical-axis at a temperature of around 500K (Kelvin) (Chronological Scientific Tables issued on Nov. 27, 2015). Here, the reason why the linear expansion coefficient at the temperature of around 500K is mentioned is that it is preferred to examine the linear expansion coefficient at such a temperature because the temperature for sealing the lid member 60 on the first substrate 11 is often selected from the temperature in a range of about 400K to 600K. Then, as the metal material for forming the lid member 60, a material exhibiting a linear expansion coefficient close to the linear expansion coefficient of the crystal is preferred, and thus, for example, copper (the linear expansion coefficient is 18.3 near the above-described temperature according to the above-described Chronological Scientific Table) or nickel (the linear expansion coefficient is 15.3 near the above-described temperature according to the above-described Chronological Scientific Table) is preferred. When the lid member 60 is formed of copper, it is preferred to plate the surface with nickel in order to improve corrosion resistance.

When each of the first substrate 11 and the second substrate 13 is formed of glass, it is preferred to form the lid member 60 with kovar (the linear expansion coefficient is around 6) that is known to have a linear expansion coefficient close to that of glass.

4. Base and Piezoelectric Device of Second Embodiment

Figure 4A:
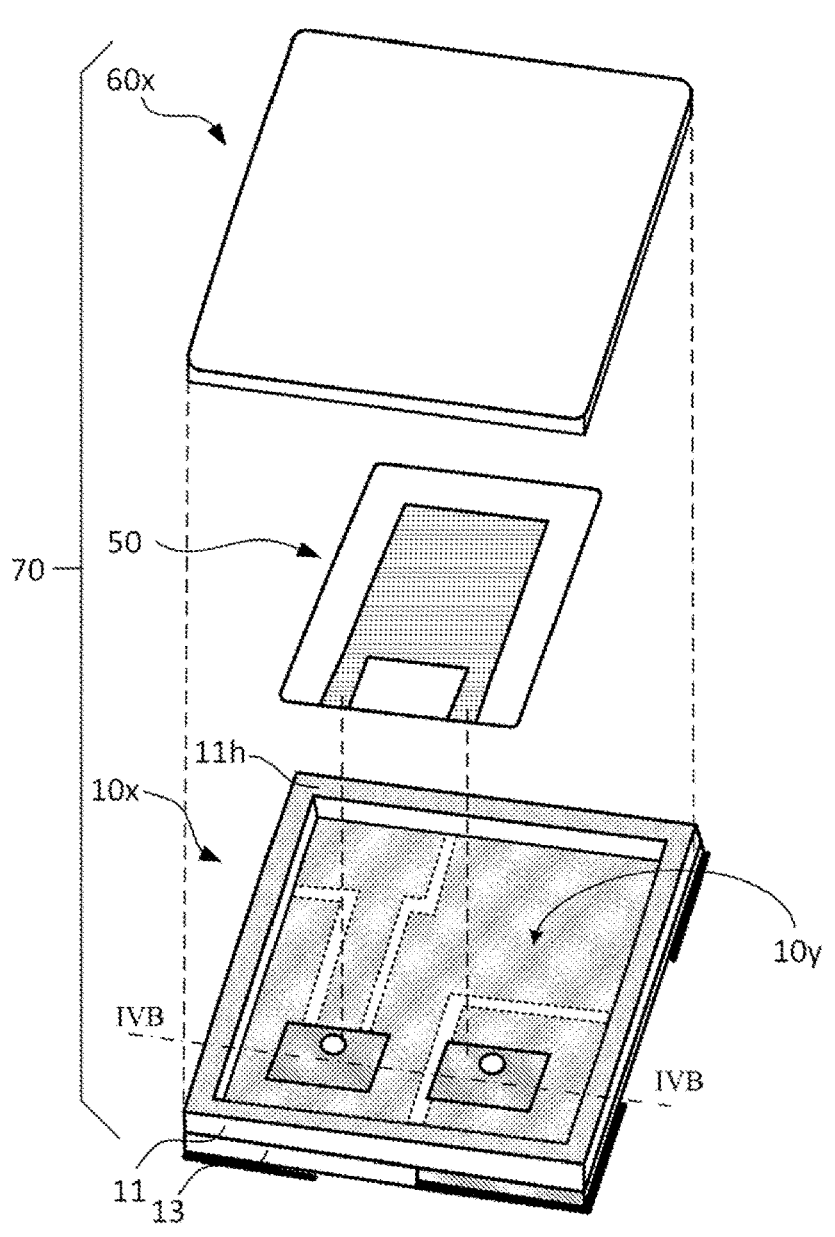
FIG. 4 A and FIG. 4B are drawings for describing a base 10x and a piezoelectric device 70 of a second embodiment.
Figure 4B:
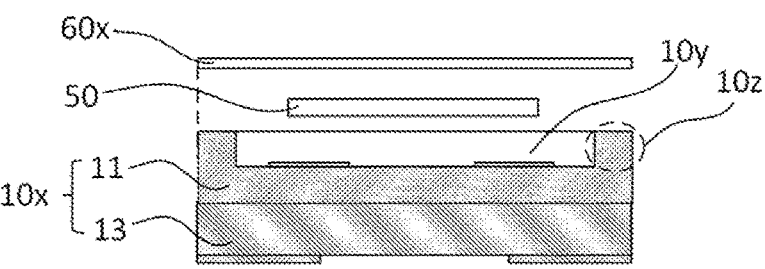

Next, with reference to FIG. 4A and FIG. 4B, a base 10x and a piezoelectric device 70 of the second embodiment will be described. FIG. 4A is an exploded perspective view for describing the base 10x and the piezoelectric device 70 of the second embodiment. FIG. 4B is a cross-sectional view of the piezoelectric device 70 taken along the line IVB-IVB of FIG. 4A.

The difference between the base 10x of the second embodiment and the first embodiment is that a depressed portion 10y containing the piezoelectric element is disposed in the first substrate 11. The difference between the piezoelectric device 70 of the second embodiment and the base 10 of the piezoelectric device 40 of the first embodiment is that a lid member 60x has a flat plate shape due to using the base 10x. Also, in a case of this example, for example, the sealing pattern 11h is disposed on a dike in a periphery of the depressed portion 10y of the first substrate 11, and the flat plate-shaped lid member 60x can be bonded to the first substrate 11 with, for example, the gold tin alloy.

The lid member 60x in this case is also preferably made of metal as in the case of the above-described lid member 60, and moreover a metal lid member is preferred in consideration of the linear expansion coefficients of the first substrate and the second substrate. That is, for example, from the reason described above, the lid member formed of copper, nickel, or kovar is preferred.

Figure 5A:
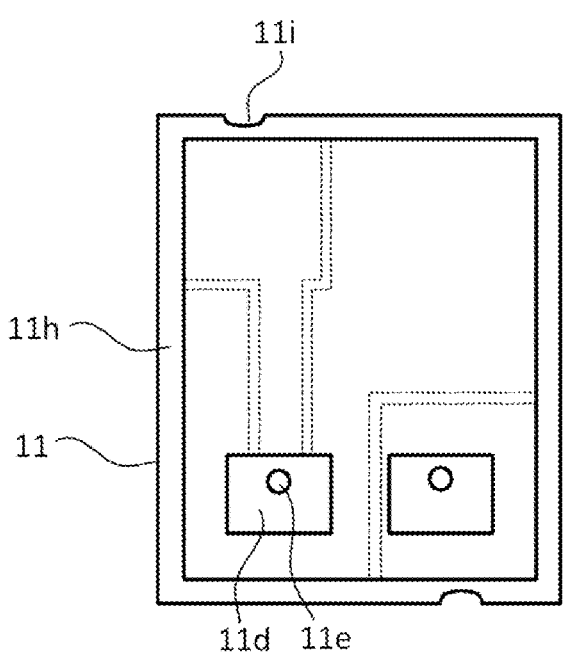
FIG. 5A to FIG. 5E are drawings for describing, especially, a castellation and external mounting terminals.
Figure 5B:
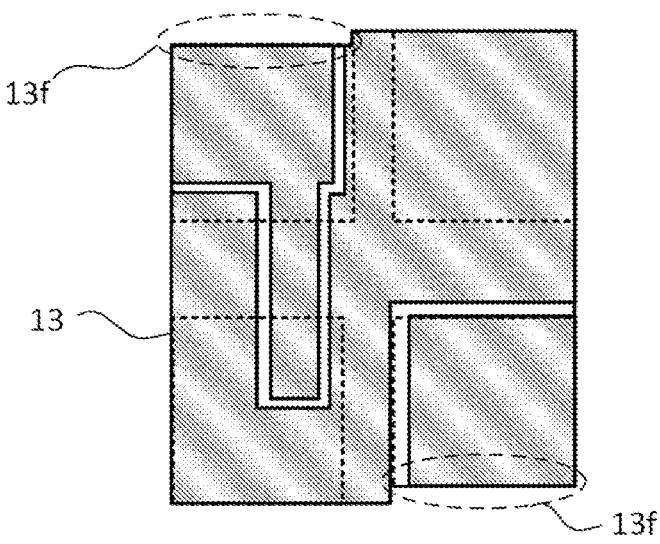
Figures 5C, 5D, 5E:
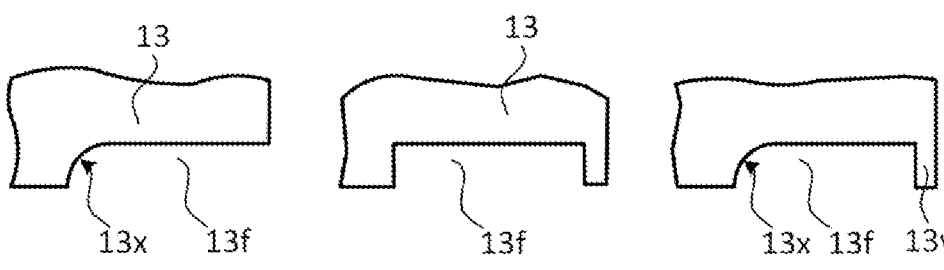

5. Other Embodiments 5-1. Castellation Structure
FIG. 5A to FIG. 5E are drawings for describing preferred examples of the castellations 13f. Especially, FIG. 5A and FIG. 5B are plan views of the first substrate 11 and the second substrate 13, and FIG. 5C to FIG. 5E are enlarged figures indicating examples of the preferred castellations.

First, as illustrated in FIG. 5A, it is preferred to dispose cut-out portions 11i for viewing the castellations 13f from above at the portions of the first substrate 11 corresponding to the castellations 13f disposed in the second substrate 13. When a piezoelectric device is mounted onto a substrate of an electronic device, in many cases, a soldering quality of mounting solder is determined by checking whether the solder extends to the castellations 13f or not. The determination described above can be easily done by the cut-out portions 11i.

FIG. 5C to FIG. 5E are structure examples for reducing a damage to the piezoelectric equipment due to the shapes of the castellations 13f.

The example illustrated in FIG. 5C is an example where a R-shaped portion 13x having an R-shaped portion on the center side of the second substrate 13 of the castellation 13f is disposed. Disposing the R-shaped portion 13x easily reduces the damage to the portion on the center side of the second substrate 13 of the castellation 13f.

The example illustrated in FIG. 5D is an example where a protruding shape portion 13y having a part of the second substrate 13 remaining in a protruding shape is disposed on a corner portion side of the second substrate 13 of the castellation 13f. Disposing the protruding shape portion 13y causes the intermetallic bonding by the first metal film and the second metal film to be generated even at the protruding shape portion 13y, and thus, strength of the piezoelectric device at the corner portion of the piezoelectric device can be enhanced.

The example illustrated in FIG. 5E is a structural example where both the R-shaped portion 13x and the protruding shape portion 13y, which are described above, are disposed to bring out advantages of both of them.

Figure 6A:
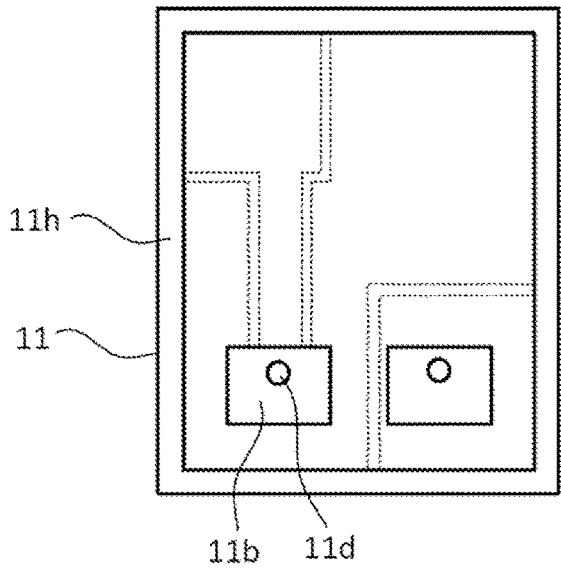
FIG. 6A to FIG. 6E are drawings for describing, especially, contact holes.
Figures 6B, 6C, 6D:
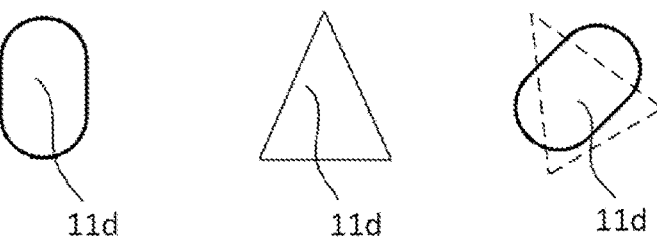
Figure 6E:
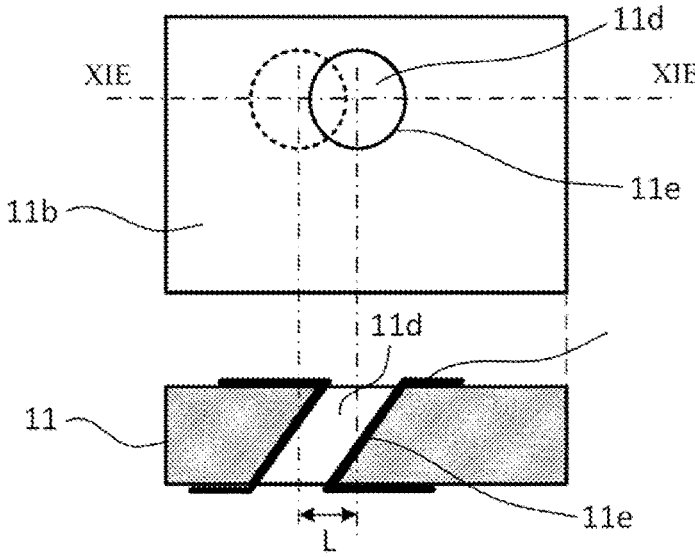

5-2. Contact Hole Structure
FIG. 6A to FIG. 6E are drawings for describing preferred examples of the contact holes 11d. Especially, FIG. 6A is a plan view illustrating relationship between the contact holes 11d and the first substrate 11, FIG. 6B to FIG. 6D are enlarged figures illustrating preferred planar shapes and arrangement directions of the contact holes 11d in FIG. 6A, and FIG. 6E is a plan view and a cross-sectional view taken along the line XIE-XIE illustrating the preferred example of a positional relationship between the front surface and the back surface of the first substrate 11 of the contact hole 11d.

When the first substrate 11 is formed of a quartz substrate, since the crystal is a crystal body, an anisotropy with respect to an etching solution due to a crystallographic axis of the crystal occurs in forming the contact hole, and an opening state of the contact hole is not as desired, in some cases. In such a case, desired contact hole wiring cannot be formed, resulting in deterioration of wiring resistance, or the like, in some cases. To avoid it, it is sometimes better to devise the shape of the contact hole or the like for a direction where etching is difficult.

The example of FIG. 6B is an example of the contact hole having an elongated hole shape in a direction where etching is difficult. The example of FIG. 6C is an example of the contact hole having an elongated triangular shape in a direction where etching is difficult. The example of FIG. 6D is an example of the contact hole having an elongated hole shape when viewed in a plane in a direction where etching is difficult. A longitudinal direction of the elongated hole or the elongated triangular shape can be any direction in consideration of an etching direction (FIG. 6D).

Due to an etching anisotropy of the crystal described above, the direction where etching is predominant is not a thickness direction of the first substrate 11, but an oblique direction at a certain angle to the thickness direction, in some cases. FIG. 6E shows an example of countermeasures against it. FIG. 6E shows an example of performing etching by shifting an opening of an etching resist mask for forming the contact hole 11d by a dimension L between the front surface and the back surface of the first substrate 11. This allows forming the contact hole wiring by utilizing an inclined surface of an inner surface of the contact hole 11d and thus, improvement of the wiring resistance can be expected. While the dimension L to be shifted is not limited to this, it is preferred to be set as a dimension, for example, selected from a range of one-third to one-half of a diameter of the contact hole 11d.

5-3. Planar Shapes of First Metal Film and Second Metal Film

Figure 7:
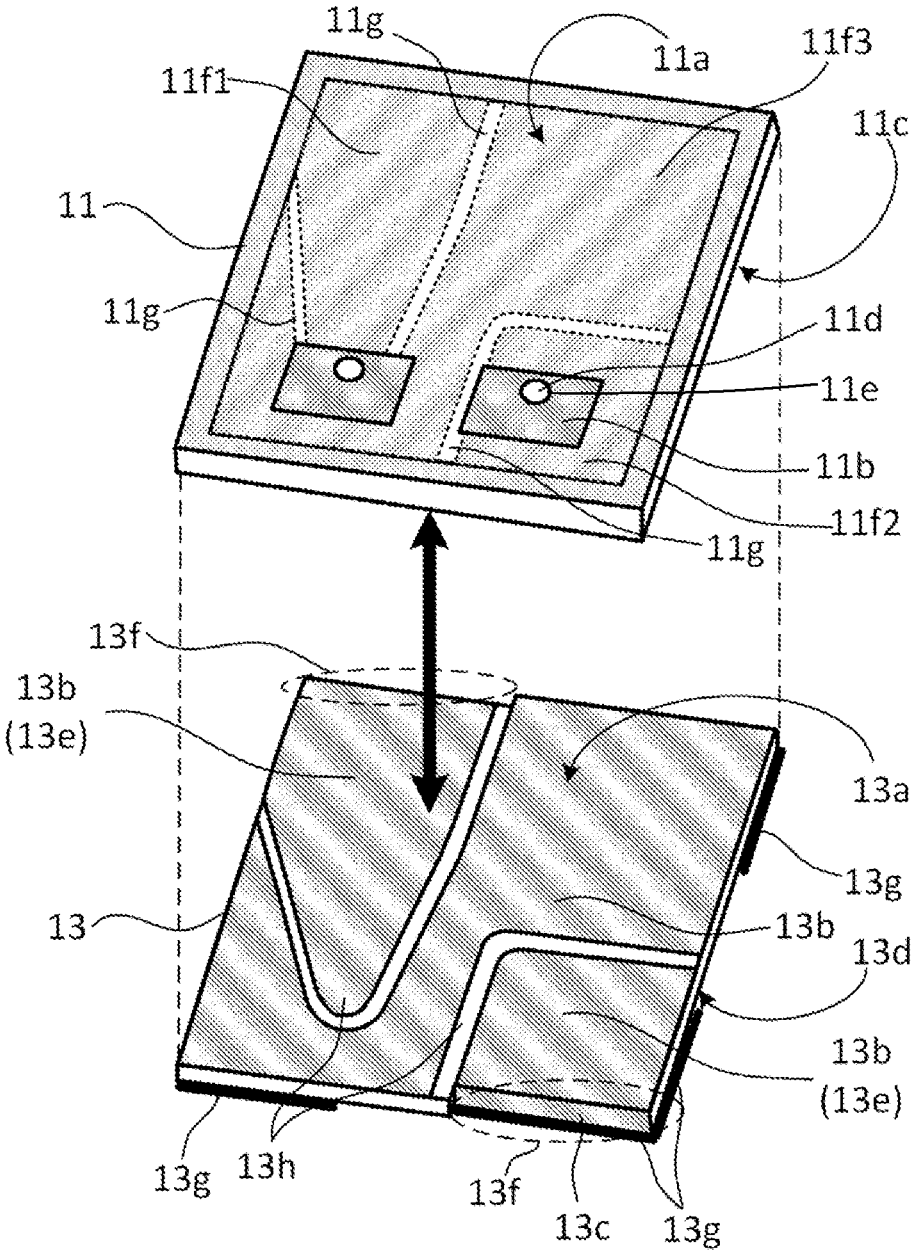
FIG. 7 is a drawing for describing, especially, a modification of planar shapes of a first metal film and a second metal film.

When forming the base 10 of the disclosure, the first metal film 11*f* and the second metal film 13*b* form the intermetallic bonding by heating and pressurizing the first substrate and the second substrate, which are in a state of being brought into contact with one another, under reduced pressure. Accordingly, the air between the first substrate and the second substrate is preferably eliminated as much as possible. FIG. 7 is a drawing for describing a structural example for it. That is, FIG. 7 shows an example where, in order to make it as easy as possible for the air to escape when both substrates are brought into contact with one another, the planar shapes of the insulation regions 11*g* of the first substrate and the insulation regions 13*h* of the second substrate are made to have many curved lines and/or straight lines. This is preferred because the air between the substrates is more likely to escape when both substrates are brought into contact with one another to perform vacuum drawing, compared with a case where this is not done.

5-4. Case of Disposing Wiring on First Substrate

Figure 8A:
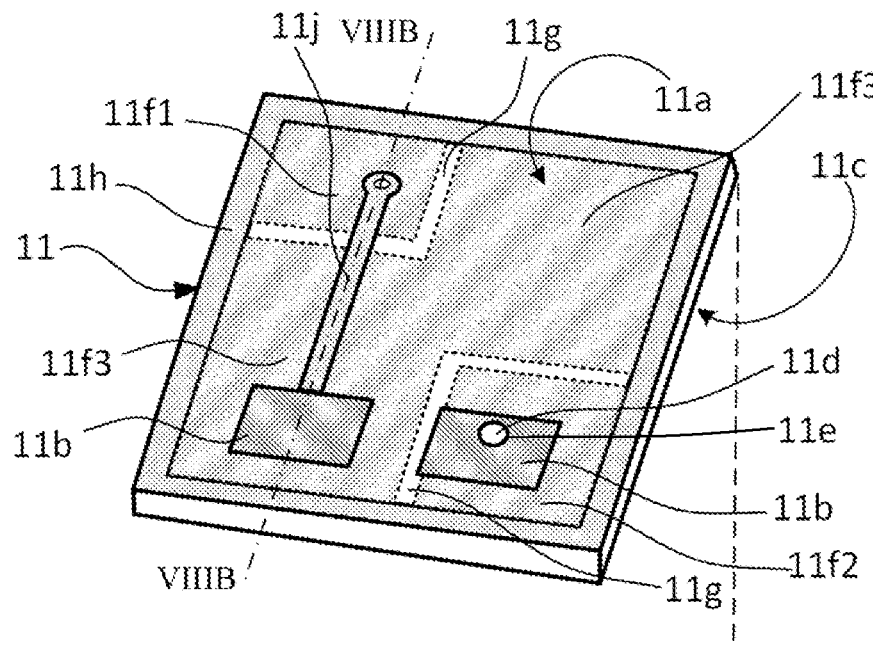
FIG. 8A and FIG. 8B are drawings for describing a preferred structural example when wiring is routed on a first substrate.
Figure 8B:
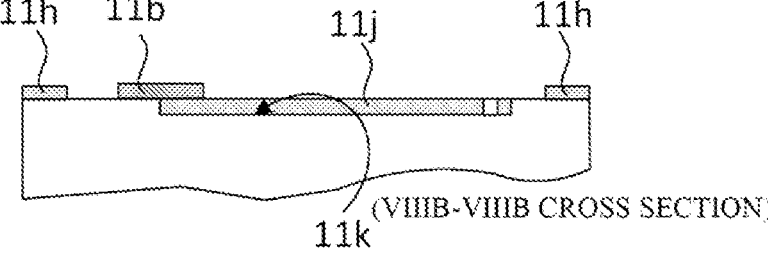

FIG. 8A is a plan view illustrating a preferred example of a case where a wiring 11*j* extending to another location on the first substrate 11 from the mounting pad 11*b* of the first substrate 11 is disposed, and FIG. 8B is a cross-sectional view of the preferred example taken along the line VIIIB-VIIIB.

There is also a high demand for a low profile type for the piezoelectric device, and in that case, it is considered that a height of the wiring 11*j* also becomes a problem. Thus, in the example of FIG. 8A and FIG. 8B, a depressed portion 11*k* for embedding the wiring 11*j* is disposed in the region of the first substrate 11 where the wiring 11*j* is to be disposed. A depth of the depressed portion 11*k* is set to a value where the wiring 11*j* can be embedded, and strength of the first substrate 11 can be ensured. Specifically, the depth of the depressed portion 11*k* is preferably set to a value selected from a range of 10 μm to about a quarter of the thickness of the first substrate 11.

Figure 9A:
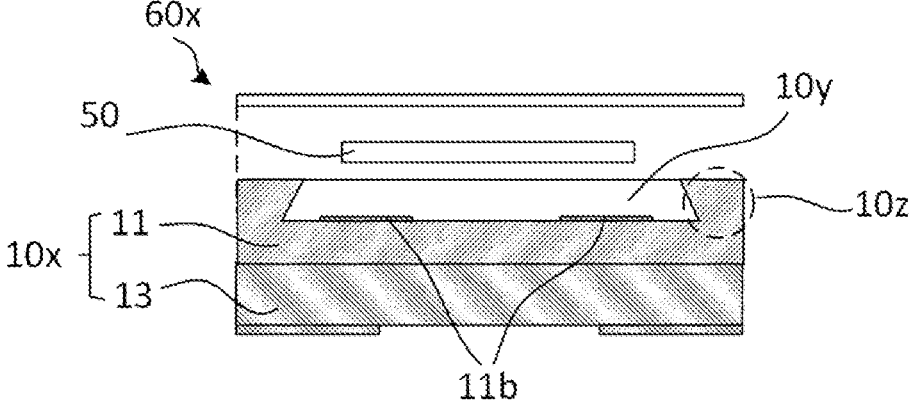
FIG. 9A and FIG. 9B are drawings for describing modifications of the base of the second embodiment.

5-5. Case of Disposing Depressed Portion for Piezoelectric Element in First Substrate As already described with reference to FIG. 4A and FIG. 4B, in the base 10*x* and the piezoelectric device 70 of the second embodiment, the depressed portion 10*y* for the piezoelectric element 50 is included in the first surface side of the first substrate 11. Accordingly, a dike 10*z* (see FIG. 4A and FIG. 4B) is generated in a periphery of the depressed portion 10*y*, namely, at an edge portion of the first substrate 11. On the other hand, in the case of the piezoelectric device 70, it is sometimes resin-molded together with other electronic components and modularized and thus, the piezoelectric device 70 is sometimes damaged by the pressure at the time of molding. Thus, as one countermeasure to avoid it, as illustrated in FIG. 9A, the dike 10*z* may have a structure where the rigidity of the dike is enhanced by, for example, overhanging it to the center side of the first substrate 11 in an eaves shape, in some cases.

Figure 9B:
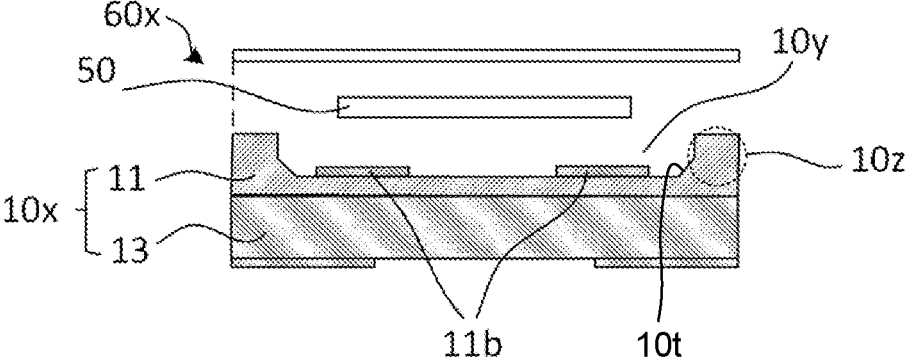

When viewed from another aspect, with respect to a piezoelectric device having the depressed portion 10*y* for the piezoelectric element 50, because of increasing demand for the low profile, thinning the thickness of the first substrate and/or the second substrate is sometimes required. For example, as illustrated in FIG. 9B, when thinning the thickness of the first substrate 11 is required, it is necessary to ensure the bonding strength with the second substrate 13 even in a state where the depressed portion 10*y* is disposed. As the preferred structural example in that case, as illustrated in FIG. 9B, it is preferred to form a structure where a tapered portion 10*t* is included at an inside corner between the depressed portion 10*y* and the dike 10*z*. This is because, in the bonding structure of the first substrate and the second substrate, the area of the thick portion of the first substrate increases as much as the tapered portion 10*t* is disposed, and thus, the bonding strength of both can be improved, compared with a case where the tapered portion is not disposed.

5-6. Pillow Portion when Mounting Piezoelectric Element onto First Substrate

In a typical piezoelectric device, as described using FIG. 3A and FIG. 3B, the quartz-crystal vibrating piece 50 as the piezoelectric element has a rectangular shape in plan view. Then, the mounting pads 11*b* are often disposed at two locations on the first substrate corresponding to both ends along one side at the one side of the piezoelectric element 50. That is, structures where the piezoelectric element 50 is mounted by cantilever support are frequently employed.

In the case of the cantilever support, when the piezoelectric element 50 is mounted onto the first substrate, the distal end side of the piezoelectric element bows and the distal end of the piezoelectric element is brought into contact with the first substrate, and this sometimes causes characteristics deterioration of the piezoelectric device.

Figure 14A:
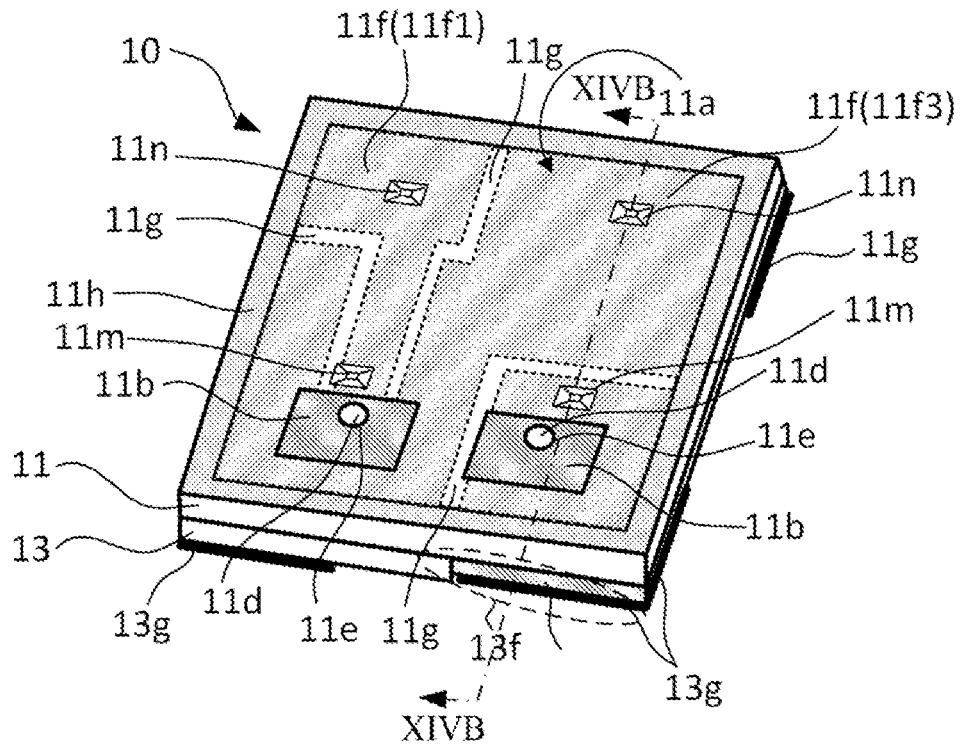
FIG. 14A and FIG. 14B are drawings for describing a preferred structural example of a surface of the first substrate where the piezoelectric element is mounted.
Figure 14B:
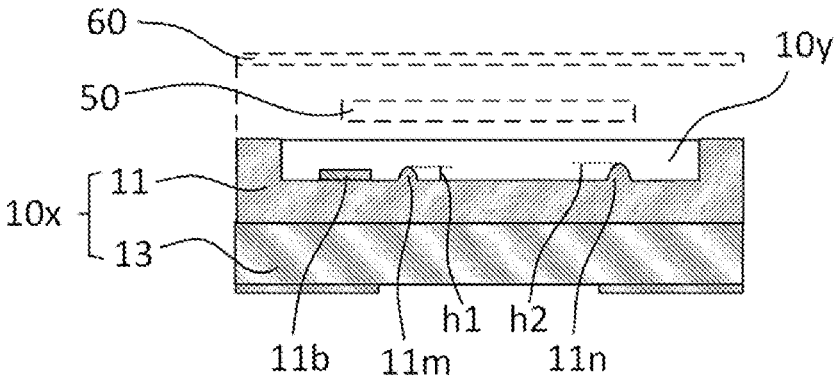

In order to avoid this situation, for example, as described by using FIG. 14A and FIG. 14B, it is preferred to have a structure where first protruding parts 11*m* integrally formed with the first substrate 11 are included, in the proximities of the center side of the piezoelectric element 50 (FIG. 14B), within two regions where the mounting pads 11*b* on the first surface 11*a* of the first substrate 11 are disposed, and second protruding parts 11*n* integrally formed with the first substrate 11 are included in regions opposed to the distal end side of the piezoelectric element 50 on the first surface 11*a* of the first substrate 11.

A height h1 of the first protruding part 11*m* and a height h2 of the second protruding part 11*n* are set to a height at which bowing of the distal end of the piezoelectric element 50 can be avoided. While not limited to this, the height h1 of the first protruding part 11*m* is preferably about 0.8 to 1.2 times, preferably approximately equal to the height of the mounting pad 11*b*, and the height h2 of the second protruding part 11*n* is preferably about 0.8 to 1.5 times, preferably approximately equal to or higher than the height of the mounting pad 11*b*.

This structure can suppress the distal end of the piezoelectric element from bowing by the first protruding part and the second protruding part.

The first protruding part and the second protruding part can be easily integrally formed with the first substrate by processing the first substrate 11 by the photolithography technique and the wet etching technique. Since top surface portions of the first protruding part and the second protruding part manufactured by such method are less likely to be sharp, and thus, even if the piezoelectric element 50 is brought into contact with them, there is little risk of damaging the piezoelectric element.

According to an aspect of this disclosure, there is provided a piezoelectric device. The piezoelectric device includes a base including: a first substrate, a mounting pad, a contact hole and a contact hole wiring, a first metal film, a second substrate, a second metal film, a routing wiring, a castellation, and an external mounting terminal. The first substrate is formed of glass or crystal. The mounting pad is for a piezoelectric element disposed on a first surface of the first substrate. The contact hole and the contact hole wiring are disposed on the first substrate. The contact hole and the contact hole wiring extend from the mounting pad to a second surface that is an opposite surface of the first surface. The first metal film is disposed in a region including a peripheral region of the contact hole of the second surface. The second substrate is made of a material identical to the material of the first substrate. The second substrate is bonded to the first substrate by intermetallic bonding. The second metal film is disposed on a third surface. The third surface is a surface on the first substrate side of the second substrate. The second metal film constitutes the intermetallic bonding together with the first metal film. The routing wiring reaches a fourth surface that is an opposite surface of the third surface of the second substrate via the third surface and a side surface of the second substrate from the contact hole wiring. The castellation is disposed on the side surface for the routing wiring. The external mounting terminal is disposed on the fourth surface, the external mounting terminal being connected to the routing wiring. The piezoelectric device includes: a piezoelectric element connected and fixed to the mounting pads with conductive members; and a lid member that is bonded to the base and seals the piezoelectric element.

According to the base of the disclosure, the base for the piezoelectric device having the structure where the first substrate and the second substrate, which are formed of glass or crystal, are laminated by the intermetallic bonding is constituted. Moreover, the base having the structure where the mounting pads for the piezoelectric element are connected to the external mounting terminals by the contact hole wirings disposed in the first substrate and the routing wirings that are disposed in the second substrate and uses the castellations is achieved. Moreover, since the periphery of the contact hole has a structure surrounded by the intermetallic bonding by first metal film and the second metal film, the contact hole region that tends to be a factor for degradation of airtightness is sealed by the intermetallic bonding. Furthermore, since the first substrate and the second substrate are formed of an identical material with one another, physical properties such as a thermal expansion coefficient are the same.

Therefore, even having the laminated structure of the first substrate and the second substrate formed of glass or crystal, it is possible to achieve the base where the airtightness is ensured.

Furthermore, since each of glass and crystal can be processed by a photolithography technique, it can be processed with relatively high accuracy, and both are relatively inexpensive as a material cost. Therefore, a highly accurate and inexpensive base can be achieved.

According to the piezoelectric device of the disclosure, it is possible to achieve a new piezoelectric device where the base having the above-described new structure is used.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A base for a piezoelectric device, comprising:
a first substrate, formed of glass or crystal;
a mounting pad for a piezoelectric element, disposed on a first surface of the first substrate;
a contact hole and a contact hole wiring, disposed on the first substrate, the contact hole and the contact hole wiring extending from the mounting pad to a second surface that is an opposite surface of the first surface;
a first metal film, disposed in a region including a peripheral region of the contact hole of the second surface;
a second substrate, made of a material identical to the material of the first substrate, the second substrate being bonded to the first substrate by an intermetallic bonding;
a second metal film, disposed on a third surface, the third surface being a surface on a side of the first substrate of the second substrate, the second metal film constituting the intermetallic bonding together with the first metal film;
a routing wiring, reaching a fourth surface that is an opposite surface of the third surface of the second substrate via the third surface and a side surface of the second substrate from the contact hole wiring;
a castellation, disposed on the side surface for the routing wiring; and
an external mounting terminal, disposed on the fourth surface, the external mounting terminal being connected to the routing wiring.

2. The base according to claim 1, wherein
the first substrate is a flat plate and includes a sealing pattern for sealing along an edge of the first substrate.

3. The base according to claim 2, wherein
a depressed portion having a depth equal to a thickness of the sealing pattern is included in a region of the first substrate for disposing the sealing pattern, and
the sealing pattern is included in the depressed portion.

4. The base according to claim 1, wherein
the first substrate includes a depressed portion for housing the piezoelectric element and a dike in a periphery of the depressed portion.

5. The base according to claim 4, wherein
a tapered portion is included in an inside corner between the depressed portion and the dike.

6. The base according to claim 1, wherein
the piezoelectric element to be mounted has a rectangular shape in a plan view,
the mounting pad is disposed at two locations on the first substrate corresponding to both ends along one side at the one side of the piezoelectric element, and
a first protruding part integrally formed with the first substrate is included, in a proximity of a center side of the piezoelectric element, within two regions of the first substrate, and
a second protruding part integrally formed with the first substrate is included in regions opposed to a distal end side of the piezoelectric element of the first substrate.

7. The base according to claim 1, wherein
each of the first metal film and the second metal film is a laminated film of a chrome film as a foundation film, a nickel film or nickel-tungsten alloy film as an intermediate film, and a gold film as an upper layer film.

8. The base according to claim 7, wherein
each of the first metal film and the second metal film includes a laminated film formed of a titanium film and a gold film laminated on the titanium film, on the upper layer film.

9. The base according to claim 1, wherein a plurality of protruding shape regions is disposed on at least one of the second surface of the first substrate and the third surface of the second substrate, and the plurality of protruding shape regions is configured for concentrating a bonding force applied to the first substrate and the second substrate from an outside during performing the intermetallic bonding.

10. The base according to claim 1, wherein the contact holes include a first contact hole and a second contact hole as two contact holes;

each of the first metal film and the second metal film includes:

a first portion, planarly surrounding a periphery of the first contact hole, a second portion, planarly surrounding a periphery of the second contact hole, and a third portion, being in charge of other region, wherein the base includes an insulation region insulating between the first portion, the second portion, and the third portion.

11. The base according to claim 9, wherein the contact holes include a first contact hole and a second contact hole as two contact holes;

each of the first metal film and the second metal film includes:

a first portion, planarly surrounding a periphery of the first contact hole, a second portion, planarly surrounding a periphery of the second contact hole, and a third portion, being in charge of other region, wherein the base includes an insulation region insulating between the first portion, the second portion, and the third portion.

12. The base according to claim 11, wherein the depressed portion between the protruding shape regions also serves as the insulation region.

13. The base according to claim 1, wherein each of the first substrate and the second substrate is formed of AT-cut plate of crystal or Z-cut plate of crystal.

14. A piezoelectric device, comprising:

the base according to claim 1;

a piezoelectric element, connected and fixed to the mounting pad with a conductive member; and a lid member, bonded to the base and sealing the piezoelectric element.

15. The piezoelectric device according to claim 14, wherein each of the first substrate and the second substrate is formed of AT-cut plate of crystal or Z-cut plate of crystal, and the lid member is a lid member made of copper or nickel.

16. The piezoelectric device according to claim 15, wherein the lid member made of copper includes a nickel plating layer on a surface thereof.

* * * * *